(12) United States Patent
Shimamura et al.

(10) Patent No.: US 9,101,050 B2
(45) Date of Patent: Aug. 4, 2015

(54) CIRCUIT MODULE HAVING ELECTRICAL SHIELD

(71) Applicant: Taiyo Yuden Co., Ltd., Tokyo (JP)

(72) Inventors: Masaya Shimamura, Tokyo (JP); Kenzo Kitazaki, Tokyo (JP); Eiji Mugiya, Tokyo (JP); Tatsuro Sawatari, Tokyo (JP); Tetsuo Saji, Tokyo (JP); Hiroshi Nakamura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/090,387

(22) Filed: Nov. 26, 2013

(65) Prior Publication Data
US 2015/0049439 A1    Feb. 19, 2015

(30) Foreign Application Priority Data
Aug. 13, 2013 (JP) .................. 2013-168377

(51) Int. Cl.
*H05K 9/00* (2006.01)
*H05K 1/02* (2006.01)

(52) U.S. Cl.
CPC .................. *H05K 1/0216* (2013.01)

(58) Field of Classification Search
CPC .... G06F 1/182; H05K 9/0016; H05K 9/0062; H05K 1/0218; H01L 23/552
See application file for complete search history.

(56) References Cited

U.S. PATENT DOCUMENTS

| | | | | |
|---|---|---|---|---|
| 7,259,041 B2* | 8/2007 | Stelzl et al. | | 438/106 |
| 8,061,012 B2* | 11/2011 | Carey et al. | | 29/592 |
| 2003/0094621 A1 | 5/2003 | Teramae et al. | | |
| 2005/0046001 A1* | 3/2005 | Warner | | 257/678 |
| 2006/0274517 A1* | 12/2006 | Coffy | | 361/816 |
| 2009/0067149 A1* | 3/2009 | Bogursky et al. | | 361/816 |
| 2009/0140402 A1* | 6/2009 | Ohtani | | 257/675 |
| 2010/0110656 A1* | 5/2010 | Ko et al. | | 361/818 |
| 2010/0157566 A1* | 6/2010 | Bogursky et al. | | 361/816 |
| 2011/0038136 A1* | 2/2011 | Carey et al. | | 361/818 |
| 2012/0000699 A1 | 1/2012 | Inoue | | |
| 2012/0008288 A1 | 1/2012 | Tsukamoto et al. | | |
| 2013/0155639 A1* | 6/2013 | Ogawa et al. | | 361/816 |

FOREIGN PATENT DOCUMENTS

| | | |
|---|---|---|
| JP | 2003-158140 A | 5/2003 |
| JP | 2010-225620 A | 10/2010 |
| JP | 2012-019091 A | 1/2012 |

OTHER PUBLICATIONS

Office Action issued in corresponding Japanese Application No. 2013-169428 dated Nov. 26, 2013 and English translation of the same (5 pages).

* cited by examiner

*Primary Examiner* — Hoa C Nguyen
*Assistant Examiner* — Xanthia C Cunningham
(74) *Attorney, Agent, or Firm* — Fitch Even Tabin & Flannery LLP

(57) ABSTRACT

A circuit module includes a circuit substrate, a mount component, a sealing body, and a shield. The circuit substrate includes a mount surface. The mount component is mounted on the mount surface. The sealing body is formed on the mount surface, covers the mount component and has a trench formed from a main surface of the sealing body to the mount surface. The trench includes side walls configured of a first side wall at a mount surface side and a second side wall at a main surface side. A straight line connecting the first point and the second point has a second slope gentler than the first slope against the mount surface. The shield covers the sealing body and has an inner shield section formed within the trench and an outer shield section disposed on the main surface and the inner shield.

1 Claim, 19 Drawing Sheets

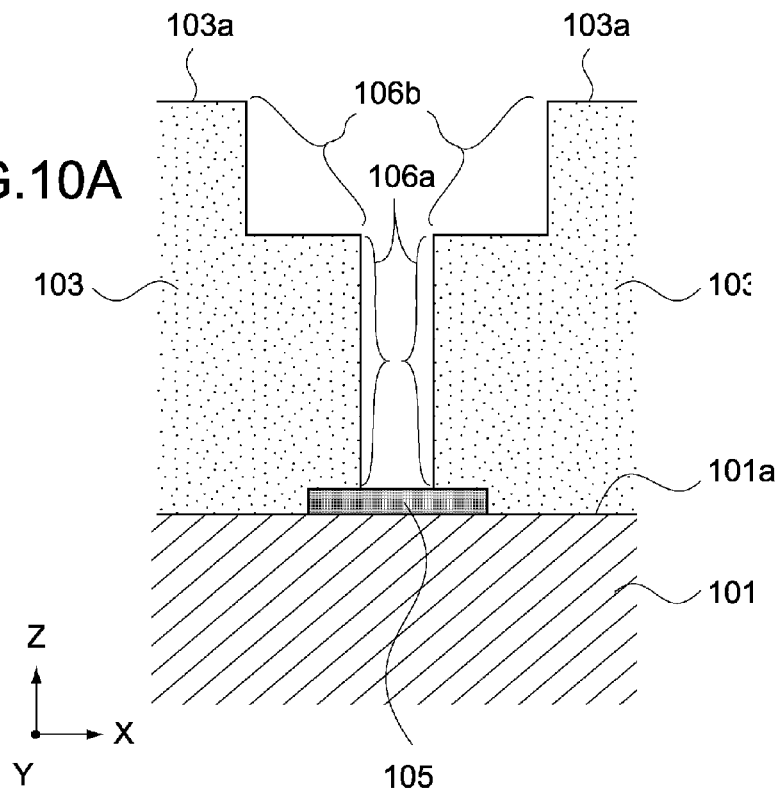
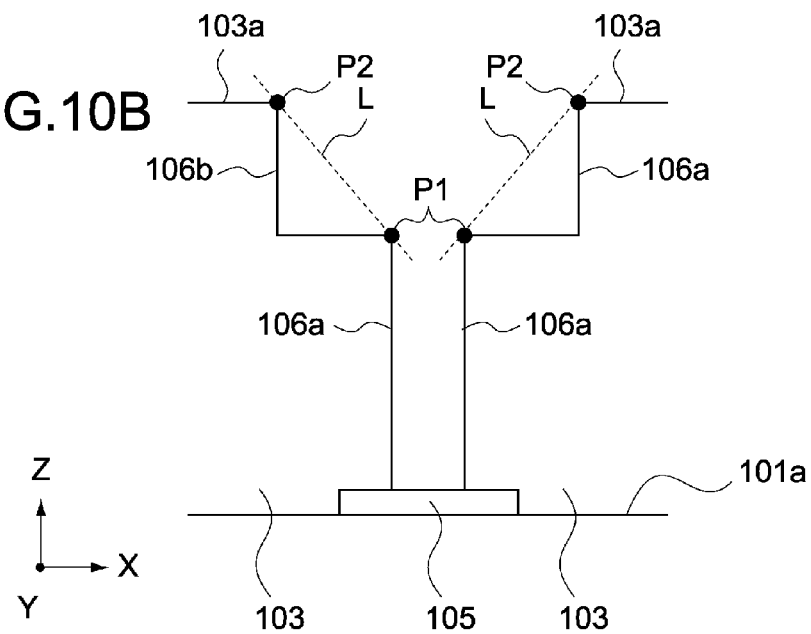

CIRCUIT MODULE HAVING ELECTRICAL SHIELD

CROSS-REFERENCE TO RELATED APPLICATION

This application claims priority under 35 U.S.C. §119 to Japanese Patent Application No. JP 2013-168377 filed on Aug. 13, 2013, the entire content of which is hereby incorporated herein by reference in its entirety.

FIELD

The present disclosure relates to a circuit module including a circuit substrate on which at least one mount component is mounted and sealed.

BACKGROUND

A widely-used circuit module includes a circuit substrate on which at least one mount component is mounted and a peripheral of the mount component is sealed with a sealing body made of a synthetic resin etc. When the mount component is a radiocommunication element, a surface of the sealing body is coated with a conductive material to be used as a shield against interruption induced by electromagnetic waves (hereinafter referred to as electromagnetic interruption). The electromagnetic interruption is interference, unnecessary radiation or the like, for example. By providing the shield, the electromagnetic interruption caused by the electromagnetic waves emitted from the mount component in the shield against electronic devices etc. outside of the shield is prevented (emission is improved), or the electromagnetic interruption caused by the electromagnetic waves emitted outside from the shield against the mount component in the shield is prevented (immunity is improved).

In addition, when a plurality of mount components are mounted on the circuit substrate, there is developed a circuit module where the shields are provided to separate the mount components in order to prevent the electromagnetic interruption between the mount components. As the mount components are covered with the sealing bodies as described above, the sealing bodies are partly removed to form trenches (grooves) and the trenches are filled with a conductive material to provide the shields between the mount components. The conductive material can be a conductive resin paste.

For example, Japanese Patent Application Laid-open No. 2010-225620 describes a circuit module where slits are formed on a mold resin layer and filled with a conductive resin to form shields between electronic components.

SUMMARY

When the trenches formed in the sealing bodies are filled with the conductive resin paste, the trenches may be narrow and be filled insufficiently. If no shields are certainly formed within the trenches, it is difficult to achieve desirable shielding properties. In recent years, the circuit module gets downsized and it thus becomes difficult to sufficiently widen the trenches. Also, when a number of mount components are mounted on a small-sized circuit substrate, wide trenches limit areas for mounting the mount components.

In view of the above-described circumstances, it is desirable to provide a circuit module having excellent shielding properties and being applicable to be downsized.

According to an embodiment of the present disclosure, there is provided a circuit module including a circuit substrate, at least one mount component, at least one sealing body, and a shield.

The circuit substrate includes a mount surface.

The mount component is mounted on the mount surface.

The sealing body is formed on the mount surface, covers the mount component and has a trench formed from a main surface of the sealing body to the mount surface. The trench includes side walls configured of a first side wall at a mount surface side and a second side wall at a main surface side. The first side wall has a first slope against the mount surface in a cross section perpendicular to the mount surface and perpendicular to an extending direction of the trench. When a connection point between the first side wall and the second side wall is defined as a first point and a connection point between the second side wall and the main surface is defined as a second point, a straight line connecting the first point and the second point has a second slope gentler than the first slope against the mount surface.

The shield covers the sealing body and has an inner shield section formed within the trench and an outer shield section disposed on the main surface and the inner shield.

These and other objects, features and advantages of the present disclosure will become more apparent in light of the following detailed description of best mode embodiments thereof, as illustrated in the accompanying drawings.

BRIEF DESCRIPTION OF THE DRAWINGS

FIGS. 10A and 10B each is a schematic view showing a shape of a trench in the circuit module;

DETAILED DESCRIPTION OF THE EMBODIMENTS

Figure 1:
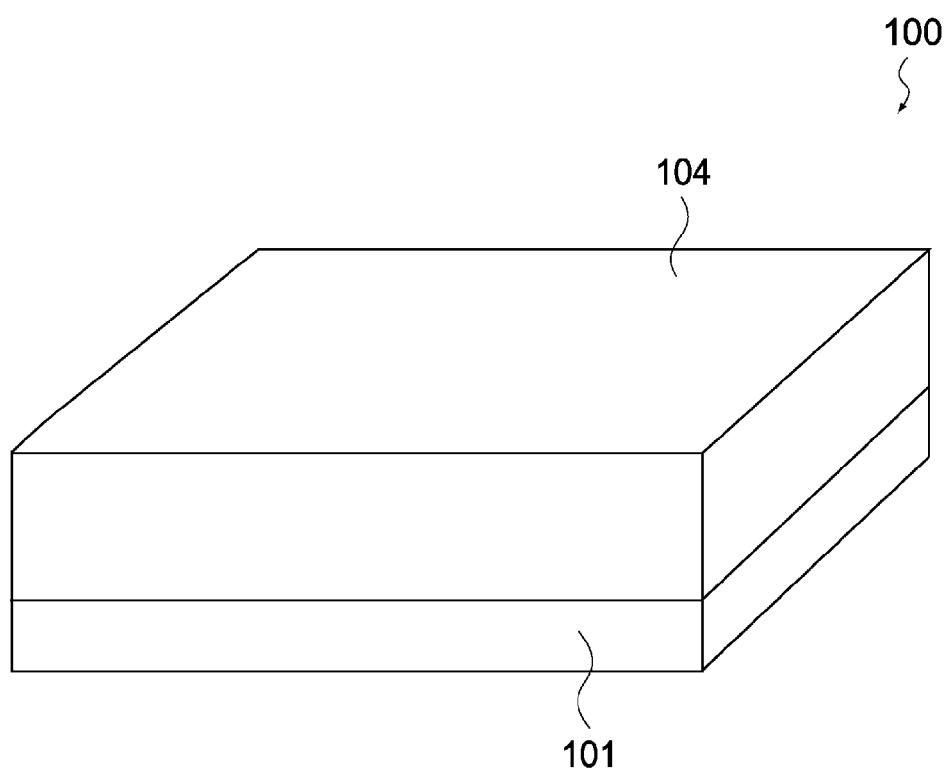
FIG. 1 is a perspective view of a circuit module according to an embodiment of the present disclosure.

A circuit module according to an embodiment of the present disclosure includes a circuit substrate, a mount component, a sealing body, and a shield.

The circuit substrate includes a mount surface.

The mount component is mounted on the mount surface.

The sealing body is formed on the mount surface, covers the mount component and has a trench formed from a main surface of the sealing body to the mount surface. The trench includes side walls configured of a first side wall at a mount surface side and a second side wall at a main surface side. The first side wall has a first slope against the mount surface in a cross section perpendicular to the mount surface and perpendicular to an extending direction of the trench. When a connection point between the first side wall and the second side wall is defined as a first point and a connection point between the second side wall and the main surface is defined as a second point, a straight line connecting the first point and the second point has a second slope gentler than the first slope against the mount surface.

The shield covers the sealing body and has an inner shield section formed within the trench and an outer shield section disposed on the main surface and the inner shield.

The shield can be formed by covering the sealing body with a shielding material after the trench is formed. When the trench is filled with the shielding material, an inner shield section is formed. Here, when the trench has the above-described shape, the trench is highly filled with the shielding material. Thus, the trench can be fully filled with the shielding material, whereby it is possible to provide the shielding properties by the inner shield section. Also, such a configuration can increase the thickness of the inner shield section at the second side wall. In this regard, the shielding properties can be enhanced. Furthermore, in such a configuration, the mount component gets close to the inner shield section. As the shielding material has a thermal conductivity higher than the shielding material of the sealing body, a heat from the mount component can be released easily through the inner shield section.

The first point may be disposed at a position higher than a mounted height of the mount component disposed adjacent to the trench.

In order to prevent the mount components disposed adjacent to the trench from exposing to the trench, it is necessary to set a certain distance between the mount components and the trench. When the side walls of the trenches each has a certain slope and widths of the trenches (widths of the side walls) are great, it is necessary to mount the mount components just spaced apart from each other. In contrast, according to the present disclosure, the side walls of the trenches each has no certain slope. In this case, even when the width of the second side wall is greater, the width of the first side wall does not become greater. There is no need to mount the mount components spaced apart from each other. In other words, the mount components can be high-density mounted.

The mount component may include a plurality of mount components.

The trench may be formed between the plurality of mount components such that the plurality of mount components are separated.

In such a configuration, it is possible to prevent the electromagnetic interruption between the mount components mounted via the trenches by the inner shield sections formed in the trenches. As described above, according to the present disclosure, the width of the second side wall can be increased and the thickness of the inner shield section can be increased, while the space between the trench and the mount component is held. It is thus possible that the mount components are high-density mounted, and the electromagnetic interruption between the mount components are effectively prevented.

The circuit module according to the embodiment of the present disclosure will be described.

[Configuration of Circuit Module]

Figure 2:
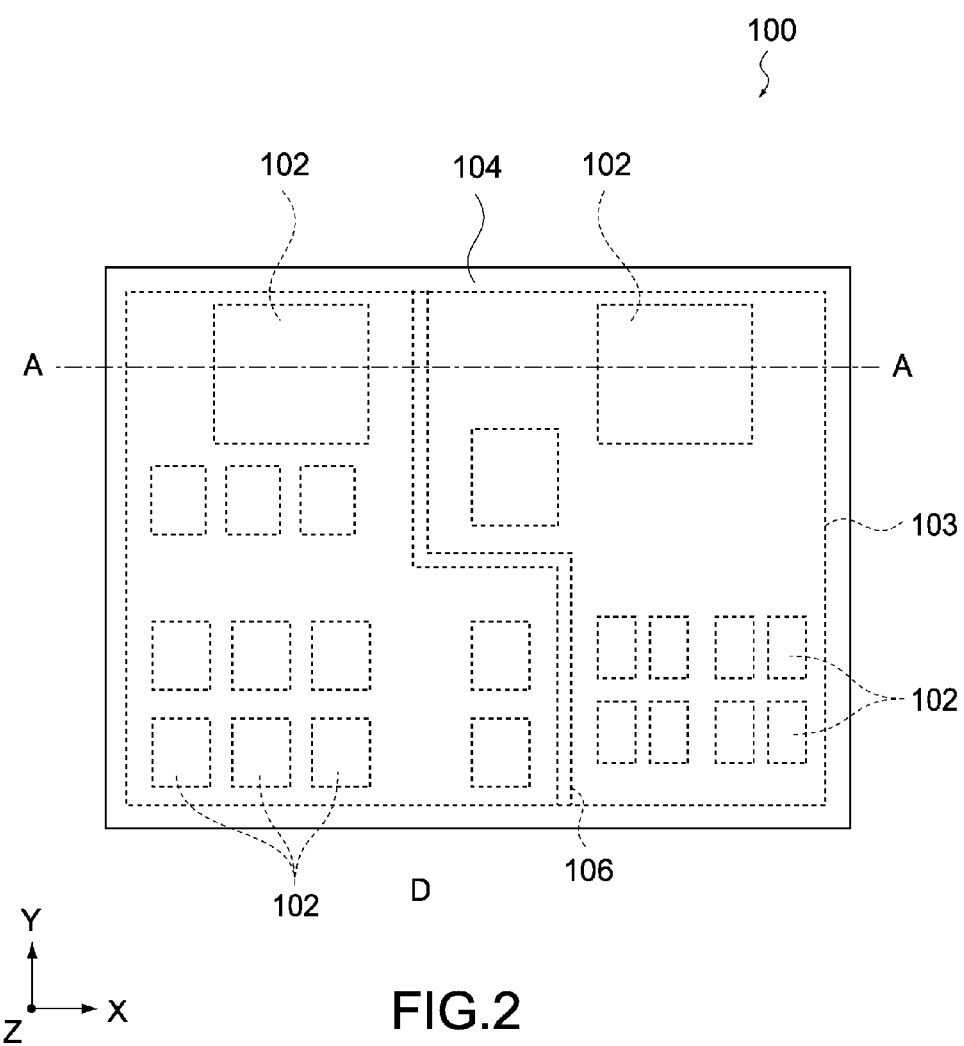
FIG. 2 is a plan view of the circuit module.
Figure 3:
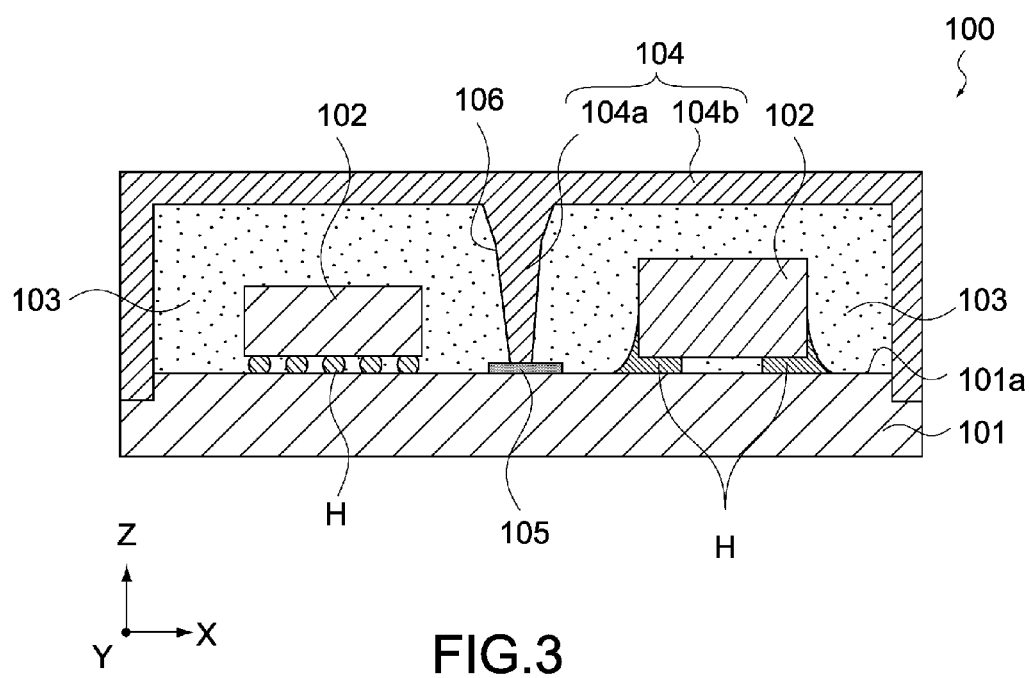
FIG. 3 is a sectional view of the circuit module.

FIG. 1 is a perspective view of a circuit module 100 according to an embodiment of the present disclosure. FIG. 2 is a plan view of the circuit module 100. FIG. 3 is a sectional view of the circuit module 100 along the A-A line in FIG. 2. In each view, an X direction, a Y direction and a Z direction are orthogonal to each other.

As shown in FIGS. 1 to 3, the circuit module 100 includes a circuit substrate 101, mount components 102, sealing bodies 103, and a shield 104. Although a size or a shape of the circuit module 100 is not especially limited, the circuit module 100 may be a rectangular parallelepiped having a size of tens mm squares and a thickness of several mms.

The mount components 102 etc. are mounted on the circuit substrate 101. The circuit substrate 101 can be a multi-layer substrate on which a plurality of layers made of an insulating material such as a glass epoxy-based material and an insulating ceramic material are laminated. Within the layers, interlayer wirings (not shown) may be formed. Hereinafter, a surface of the circuit substrate 101 on a side where the mount components 102 are mounted is defined as a mount surface 101a. The X and Y directions are parallel to the mount surface 101a, i.e., an X-Y plane is parallel to the mount surface 101a.

On the mount surface 101a, a superficial conductor 105 is disposed, as shown in FIG. 3. The superficial conductor 105 is made of a conductive material, or may be a conductive paste applied and cured on the mount surface 101a or a metal film formed by plating etc. on the mount surface 101a. The superficial conductor 105 can be disposed on the mount surface 101a along a trench 106 as described later.

The superficial conductor 105 is connected to the interlayer wirings within the circuit substrate 101, and can be electrically connected to the mount components 102 via the interlayer wirings. Specifically, the superficial conductor 105 is electrically connected to a ground terminal of the circuit module 100, and therefore can have the same potential as a ground potential of the circuit module 100.

The mount component 102 is mounted on the mount surface 101a, and is an integrated circuit (IC), a capacitor, an inductor, a resistor, a crystal oscillator, a duplexer, a filter, a power amplifier, or the like, for example. The mount component 102 can be mounted on the mount surface 101a by solder joint using solder H. As shown in FIG. 2, a plurality of mount components 102 can be mounted on the circuit substrate 101. The number or placement of mount components 102 is not especially limited.

The sealing bodies 103 is made of a sealing material, and covers the mount components 102 on the mount surface 101a. For example, the sealing material is an insulating resin such as an epoxy resin to which silica or alumina is added. After the mount components 102 are mounted on the mount surface 101a, peripherals of the mount components 102 are filled with a fluid sealing material and the sealing material is cured to provide the sealing bodies 103.

Figure 4:
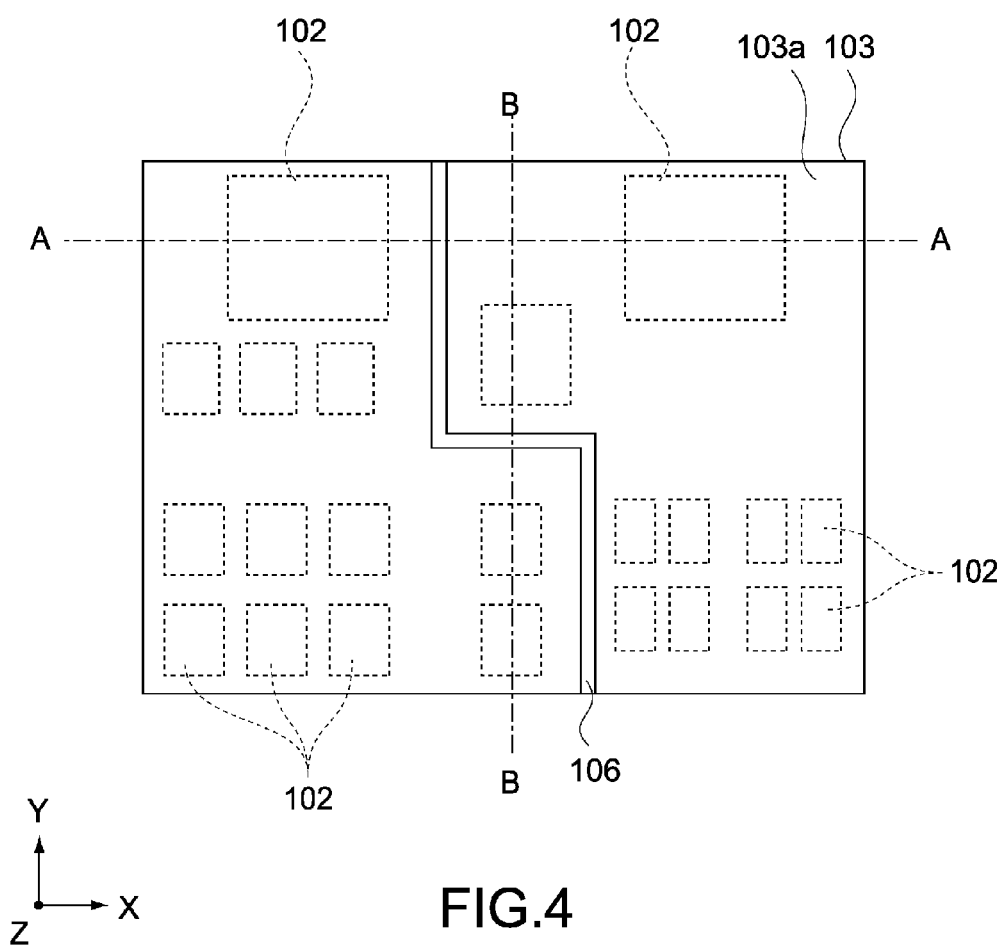
FIG. 4 is a plan view showing sealing bodies of the circuit module.
Figure 5:
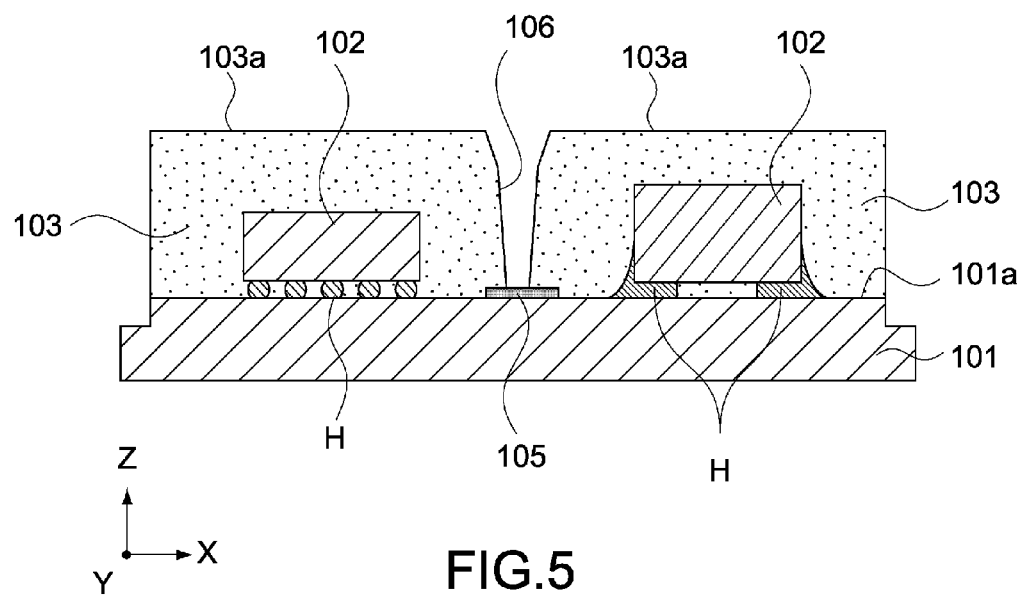
FIG. 5 is a sectional view showing the sealing bodies of the circuit module.

FIG. 4 is a plan view showing the sealing bodies 103 by omitting the shield 104 shown in FIG. 2. FIG. 5 is a sectional view showing the sealing bodies 103 by omitting the shield 104 shown in FIG. 3. As shown in FIGS. 4 and 5, the trench 106 is formed between the sealing bodies 103. Hereinafter, main surfaces of the sealing bodies 103 are defined as main surfaces 103a.

The trench 106 can be formed by removing the sealing bodies 103 in a groove shape from the main surface 103a to the mount surface 101a. Details about the trench 106 and a method of forming the trench 106 are described later. As shown in FIG. 4, the trench 106 is formed between a plurality of mount components 102 such that the mount components 102 are separated. The trench 106 is extended in a plurality of directions on the X-Y plane depending on types and placements of the mount components 102, as shown in FIG. 4. For example, the trench 106 is extended in a Y direction at an intersection of the A-A line in FIG. 4, and the trench 106 is extended in an X direction at an intersection of a B-B line.

The shield 104 is made of a shielding material that is a conductive material, and functions as a shield against electromagnetic interruption. For example, the shielding material can be a conductive resin such as an epoxy resin containing conductive particles such as Ag and Cu.

The shield 104 has an inner shield section 104a and an outer shield section 104b, as shown in FIG. 3. The inner shield section 104a may be formed within the trench 106, abut on the superficial conductor 105 via the trench 106, and be electrically connected to the superficial conductor 105.

The outer shield section 104b is disposed over the main surfaces 103a (see FIG. 5) of the sealing bodies 103 and the inner shield section 104a. The outer shield section 104b is formed successively with the inner shield section 104a, and is electrically connected to the superficial conductor 105 via the inner shield section 104a. As described above, the superficial conductor 105 can be a ground of the circuit module 100, and the shield 104 can have a ground potential.

The circuit module 100 has an overall configuration as described above. In the circuit module 100, the electromagnetic interruption can be prevented by the shield 104. Specifically, the electromagnetic interruption from outside of the circuit module 100 to the mount components 102 is prevented by the outer shield section 104b, and the electromagnetic interruption from the mount components 102 to outside of the circuit module 100 is prevented by the inner shield section 104a. Also, the electromagnetic interruption between the mount components 102 is prevented by the inner shield section 104a.

[About Trench and Shield]

Figure 6:
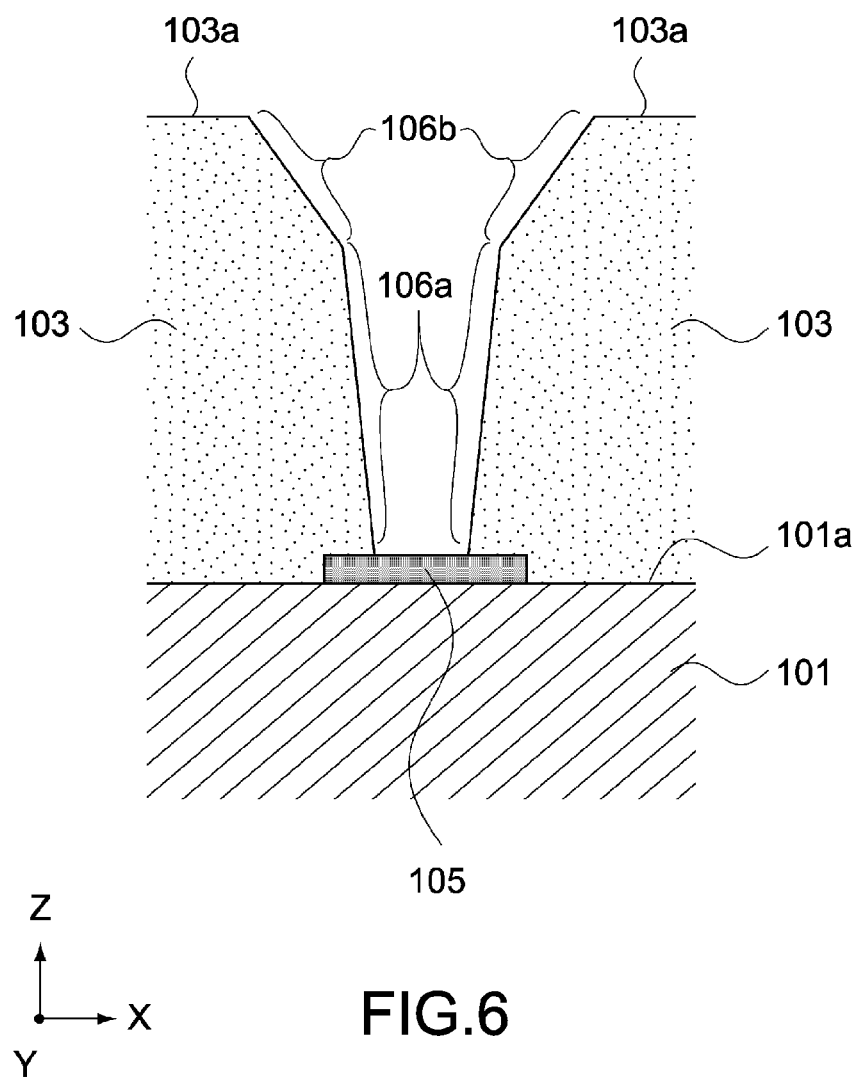
FIG. 6 is an enlarged sectional view showing the sealing bodies of the circuit module.

Details of the trench 106 will be described. FIG. 6 is a sectional view showing the trench 106 and is an enlarged view of FIG. 5. Also, FIG. 6 is a sectional view showing the sealing bodies 103 along the A-A line in FIG. 2. The section is a plane (an X-Z plane) perpendicular to the mount surface 101a (the X-Y plane) and perpendicular to an extending direction (a Y direction) of the trench 106.

As shown in FIG. 6, the trench 106 includes side walls configured of a first side wall 106a and a second side wall 106b. The first side wall 106a of the side wall in the trench 106 is at a mount surface 101a side, and has a certain slope from the mount surface 101a side. The second side wall 106b of the side wall in the trench 106 is at a main surface 103a side, and is not continued with the slope of the first side wall 106a.

Figure 7A:
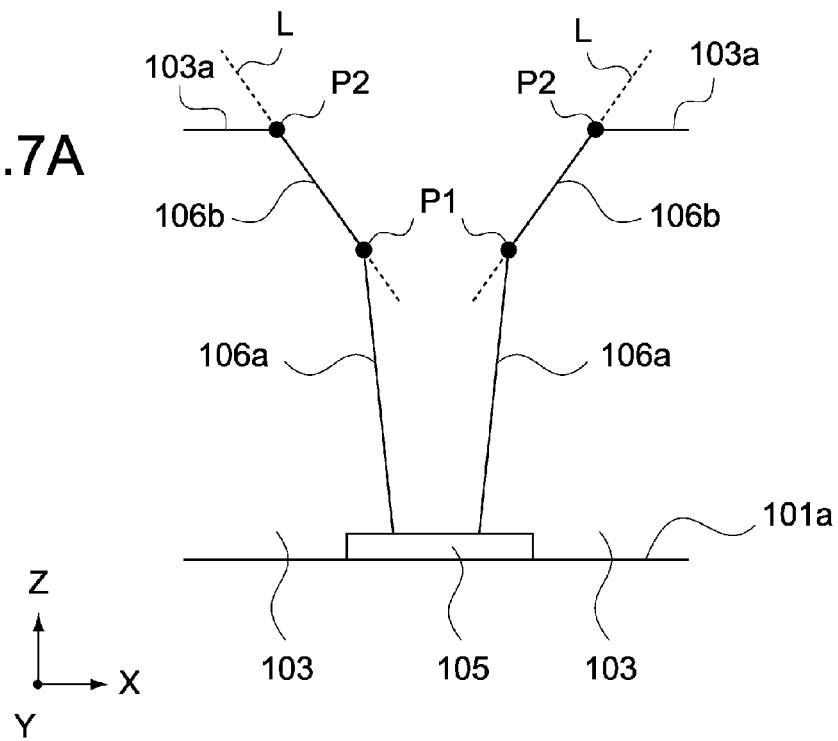
FIGS. 7A and 7B each is a schematic view showing a shape of a trench in the circuit module.
Figure 7B:
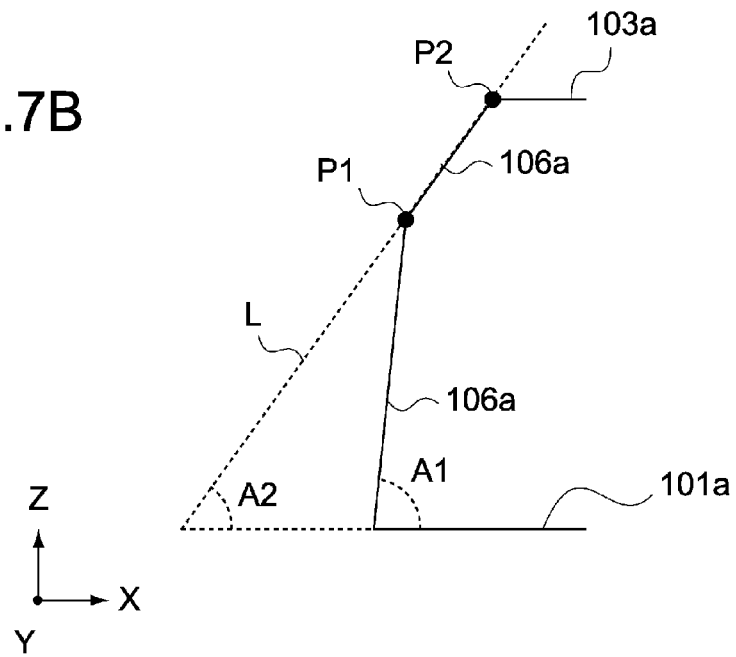
Figure 8A:
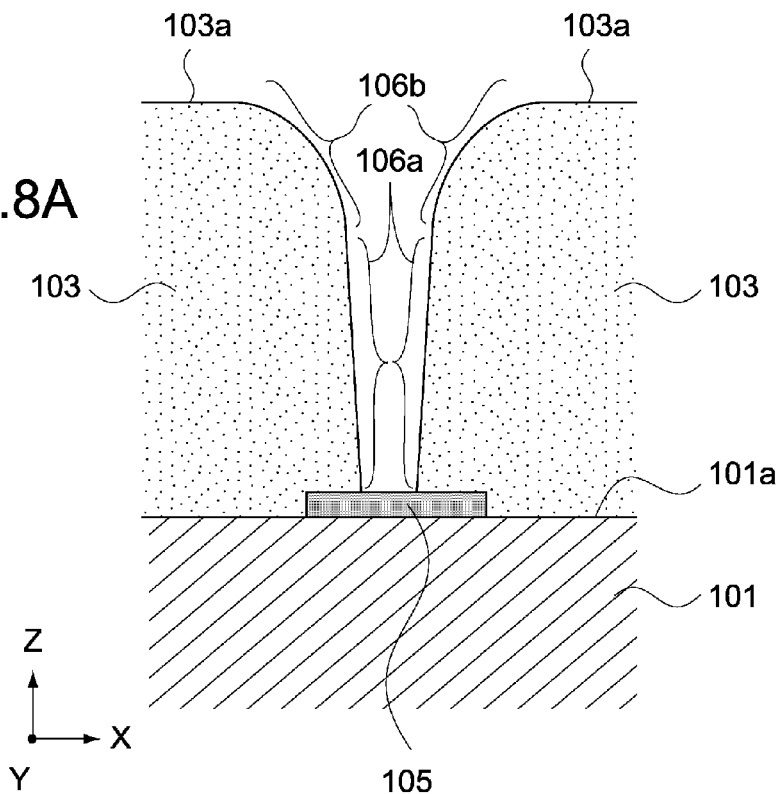
FIGS. 8A and 8B each is a schematic view showing a shape of a trench in the circuit module.
Figure 8B:
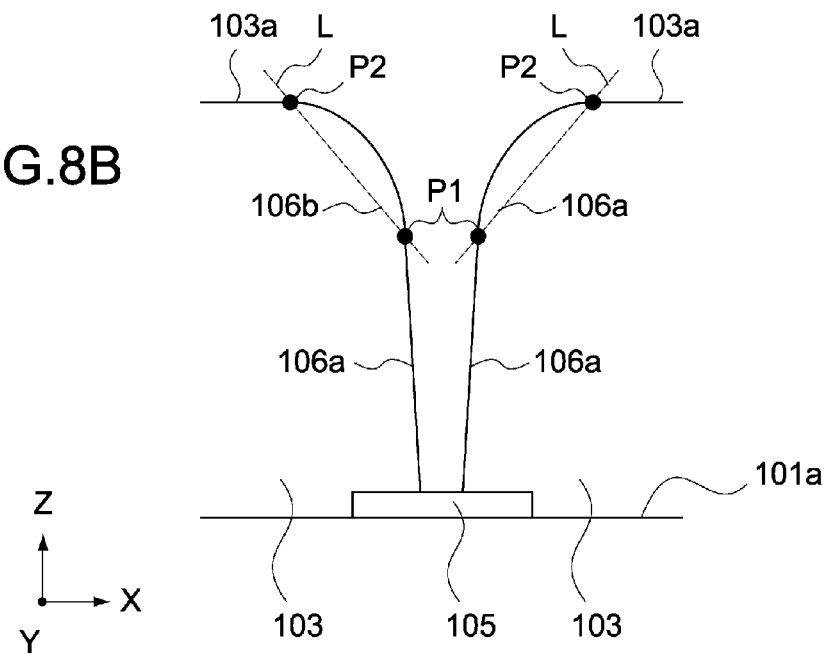
Figure 9A:
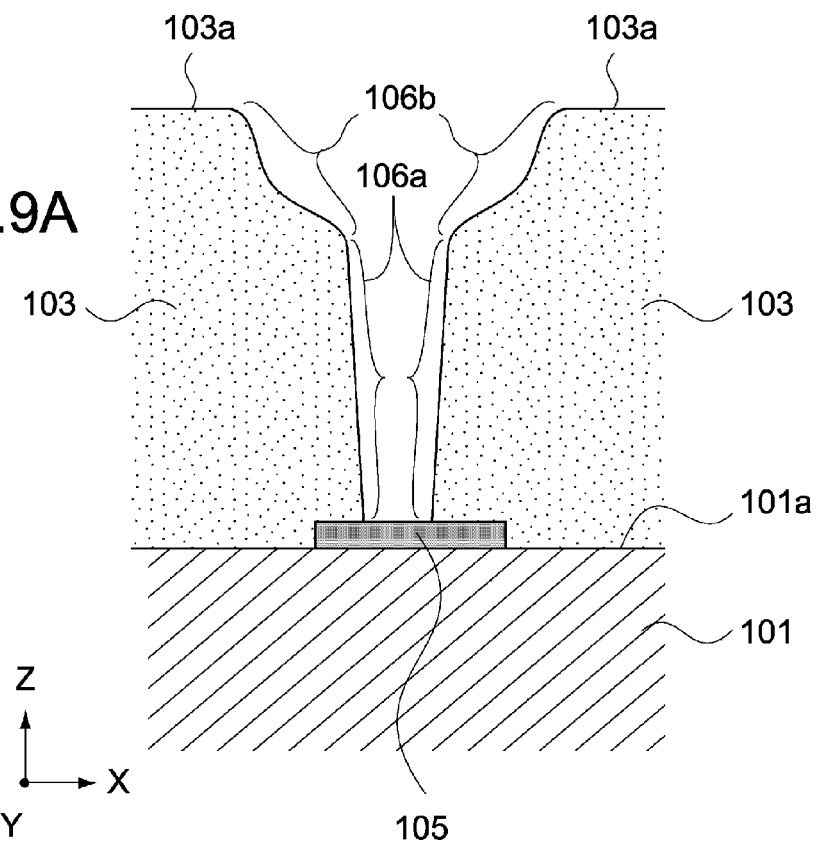
FIGS. 9A and 9B each is a schematic view showing a shape of a trench in the circuit module.
Figure 9B:
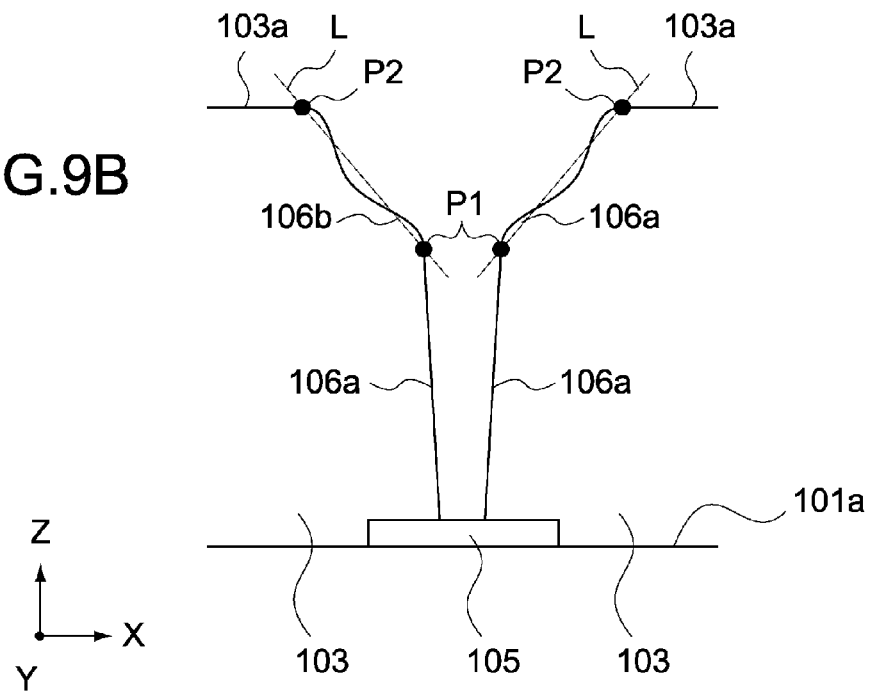

FIGS. 7A and 7B each is a schematic view showing the side walls of the trench 106. FIG. 7A shows the same section as FIG. 6. As shown in FIG. 7A, a connection point between the first side wall 106a and the second side wall 106b is defined as P1, and a connection point between the second side wall 106b and the main surface 103a is defined as P2. A straight line connecting the point P1 and the point P2 is defined as a straight line L.

FIG. 7B is a schematic view showing a slope of the first side wall 106a and the line L. As shown in FIG. 7B, an angle between the first side wall 106a and the mount surface 101a is defined as A1, and an angle between the line L and the mount surface 101a is defined as A2, which is smaller than A1.

In the trench 106, the first side wall 106a and the second side wall 106b only have to satisfy the above-described relationship. FIGS. 8A, 8B, 9A, 9B, 10A, 10B, 11A and 11B each is a sectional view or a schematic view showing a variety of shapes of the trench 106 according to the embodiment, and shows a section of the plane (the X-Z plane) perpendicular to the mount surface 101a (the X-Y plane) and perpendicular to the extending direction (the Y direction) of the trench 106.

Figure 11A:
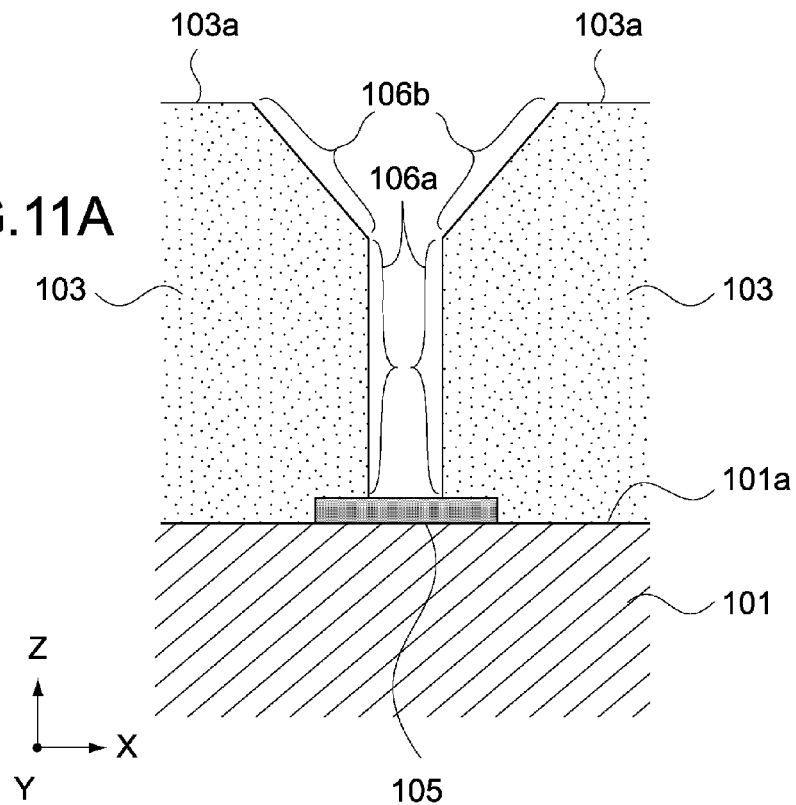
FIGS. 11A and 11B each is a schematic view showing a shape of a trench in the circuit module.
Figure 11B:
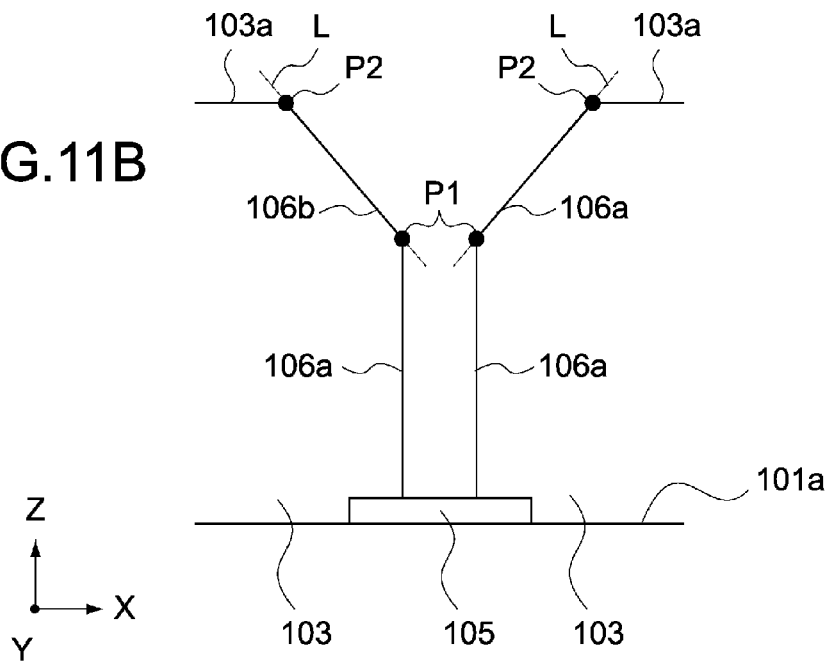

As shown in FIGS. 8A, 8B, 9A and 9B, the second side wall 106b may be curved. As shown in FIG. 10A and 10B, a part of the first side wall 106a and the second side wall 106b may be perpendicular to the mount surface 101a. As shown in FIGS. 11A and 11B, only the first side wall 106a may be perpendicular to the mount surface 101a. In either case, the angle between the line L and the mount surface 101a is smaller than the angle between the first side wall 106a and the mount surface 101a.

Figure 12:
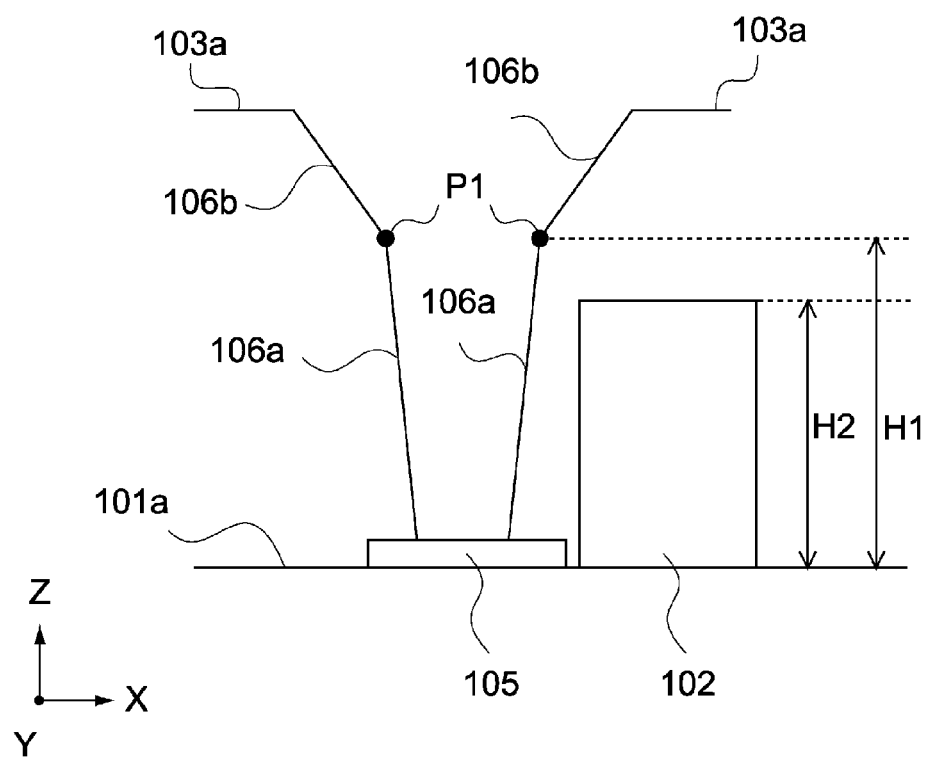
FIG. 12 is a schematic view showing a relationship between a shape of a trench and a height of a mount component in the circuit module.

In addition, it is preferable that the point P1 in the trench 106 be disposed at a position higher than a mounted height of the mount component 102 disposed adjacent to the trench 106. FIG. 12 is a schematic view showing a relationship between the point P1 and the mounted height of the mount component 102. As shown in FIG. 12, when a height of the point P1 (from the mount surface 101a) is defined as H1 and the mounted height of the mount component 102 (from the mount surface 101a) disposed adjacent to the trench 106 is defined as H2, the height H1 is higher than the height H2. The same is applicable to each and every shape of the trench 106 as described above.

As described above, the shield 104 is formed to cover the sealing bodies 103. Specifically, the inner shield section 104a is formed within the trench 106, and the outer shield section 104b is disposed over the main surfaces 103a (see FIG. 5) of the sealing bodies 103 and the inner shield section 104a.

Figure 13:
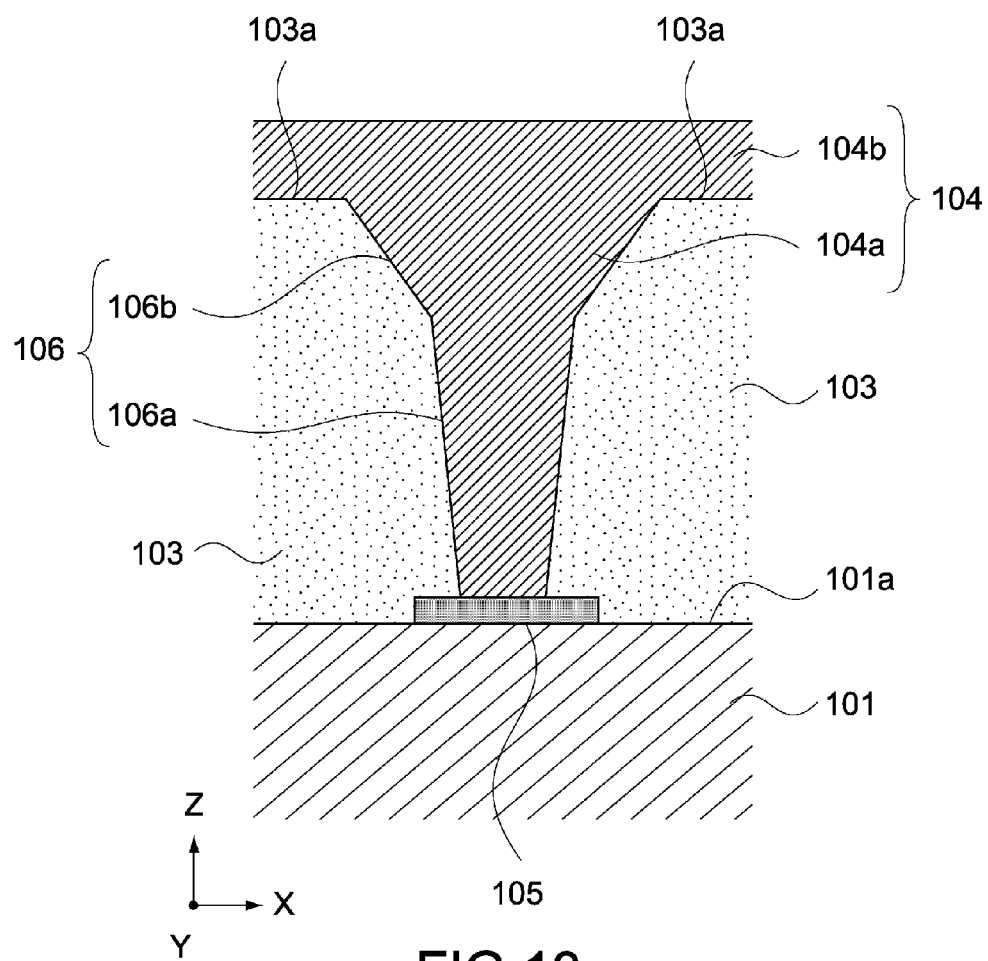
FIG. 13 is an enlarged sectional view showing a shield in the circuit module.

FIG. 13 is an enlarged sectional view showing the shield 104. As shown in FIG. 13, the inner shield section 104a is formed within the trench 106 with no space between the first side wall 106a and the second side wall 106b. As described above, as the slope of the line L of the second side wall 106b is gentler than the slope of the line L of the first side wall 106a, the inner shield section 104a between the second side walls 106b is thicker than the inner shield section 104a between the first side walls 106a.

[Production Method]
[Method of Producing Circuit Module]

A method of producing the circuit module 100 will be described. FIGS. 14A to 14C and FIGS. 15A to 15C each is a schematic view showing a method of producing the circuit module 100. A plurality of circuit modules 100 can be produced on one circuit substrate at the same time, and be divided into each circuit module 100. Hereinbelow, one of the circuit modules 100 will be described.

Figure 14A:
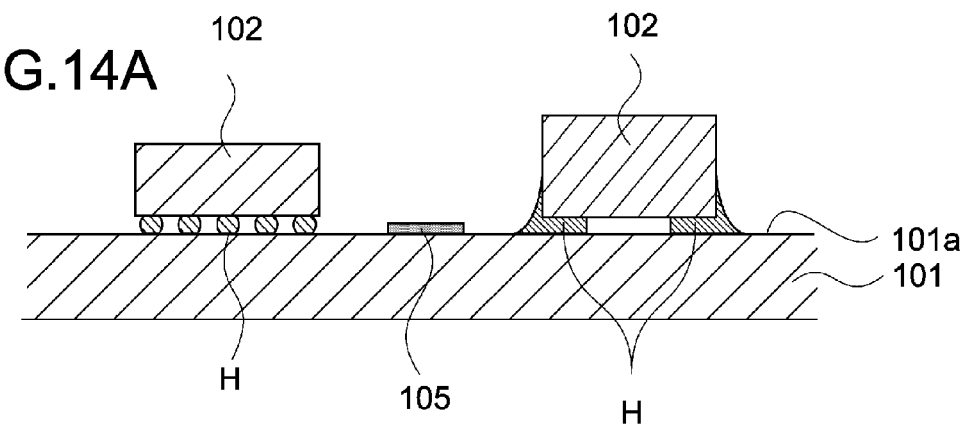
FIGS. 14A to 14C each is a schematic view showing a method of producing the circuit module.

As shown in FIG. 14A, the mount components 102 are mounted on the mount surface 101a of the circuit substrate 101. Mounting can be performed by a variety of mounting methods including solder joint. In this case, the superficial conductor 105 is disposed in advance on the mount surface 101a.

Figure 14B:
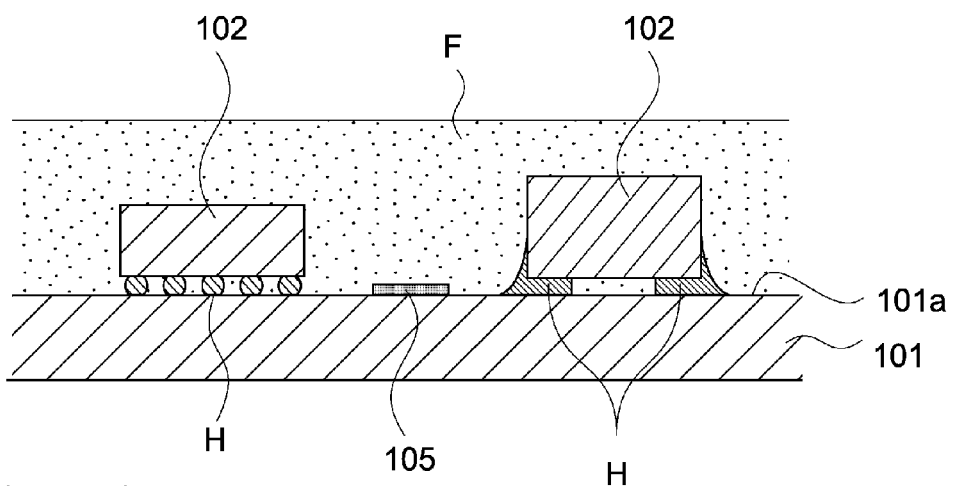

Next, as shown in FIG. 14B, the mount components 102 are filled and covered with a sealing material F on the mount surface 101a. Filling with the sealing material F can be performed by a vacuum printing, for example. Thereafter, the sealing material F is cured to form the sealing body 103 made of the sealing material F. For example, the sealing material F can be cured by baking.

Figure 14C:
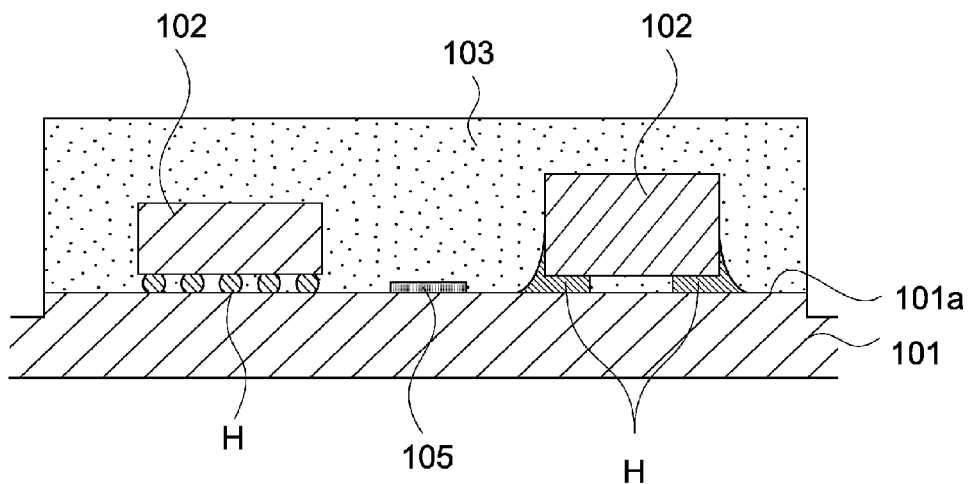

Next, as shown in FIG. 14C, the sealing body 103 is half-cut per the circuit module 100. For example, the sealing body 103 is half-cut by a dicer.

Figure 15A:
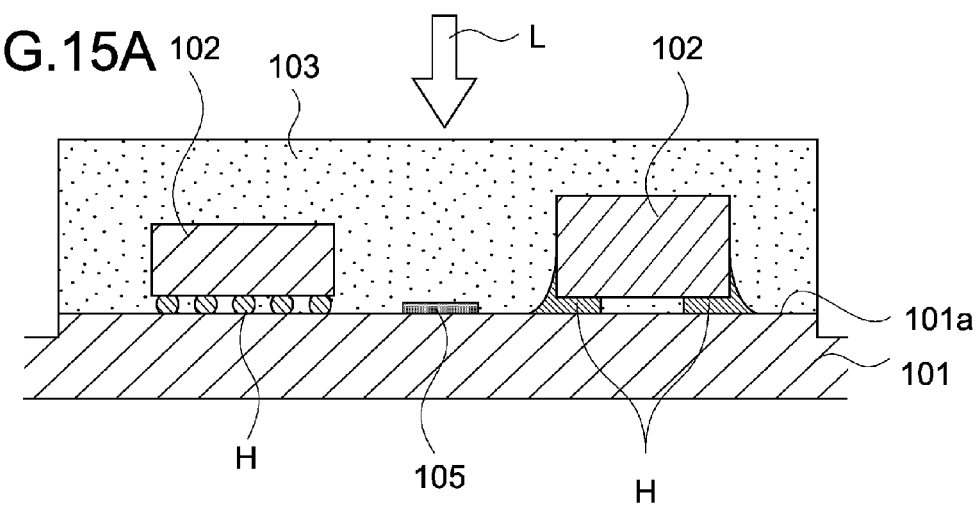
FIGS. 15A to 15C each is a schematic view showing a method of producing the circuit module.
Figure 15B:
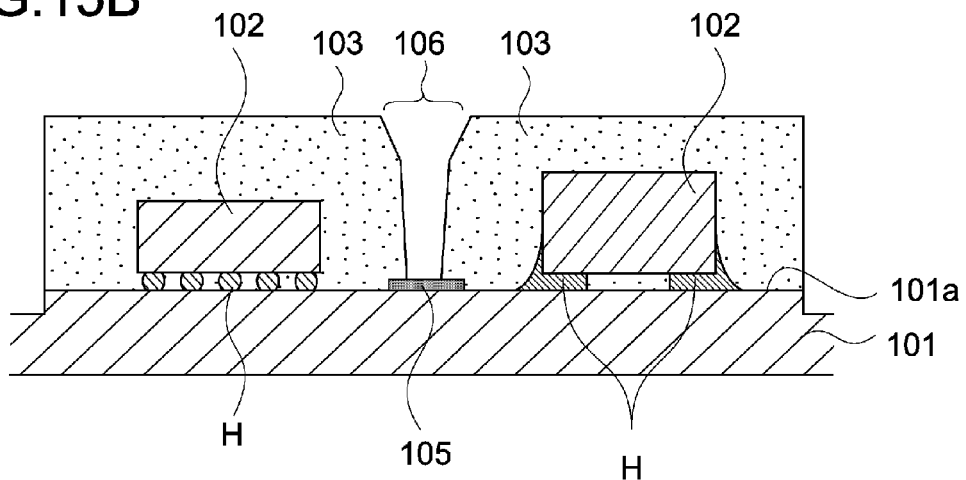

Next, as shown in FIG. 15A, the sealing body 103 is irradiated with laser L and is scanned. Irradiation of the laser L removes linearly the sealing body 103, and the trench 106 shown in FIG. 15B is formed. Depending on a scanning path of the laser L, the trench 106 having a shape (linear) as shown in FIG. 4 is formed.

Here, depending on the method of irradiation of the laser L, it is possible to form the trench 106 having the above-described first side wall 106a and second side wall 106b. For example, when the main surface 103a is irradiated with the laser L, a focal point of the laser is moved from the main surface 103a, whereby it is possible to diffuse the laser L and to form the trench 106 having the above-described shape. Also, after the laser L is scanned, it is possible that a peripheral of the trench already formed is further irradiated with the laser L to form the trench 106 having the above-described shape.

Figure 15C:
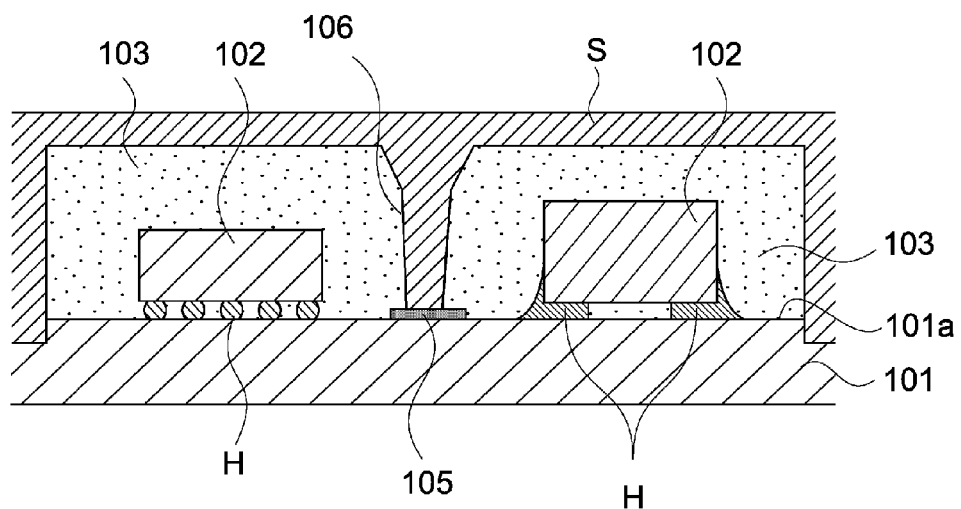

Next, as shown in FIG. 15C, a shielding material S is disposed over the sealing bodies 103. The shielding material S can be disposed by applying a conductive resin paste over the sealing bodies 103. In this case, the trench 106 is filled with the shielding material S. Thereafter, the shielding material S is cured by baking, etc. to form the shield 104.

Next, the shield 104 and the circuit substrate 101 are cut (full-cut) per circuit module 100. For example, the shield 104 and the circuit substrate 101 can be cut by the dicer. In this way, the circuit module 100 shown in FIG. 3 is produced. As described above, as the shielding material S is disposed over the sealing bodies 103 after the trench 106 is formed in the sealing bodies 103, the shape of the trench 106 determines the shape of the inner shield section 104a.

[Advantages]

The circuit module 100 according to the embodiment has the following advantages. First, it is possible to certainly form the inner shield section 104a within the trench 106. As the slope of the line L of the second side wall 106b is gentler than the slope of the line L of the first side wall 106a, the space between the second side walls 106b is wide. It is thus possible that the trench 106 is certainly filled with the shielding material (the conductive resin paste).

Figure 16:
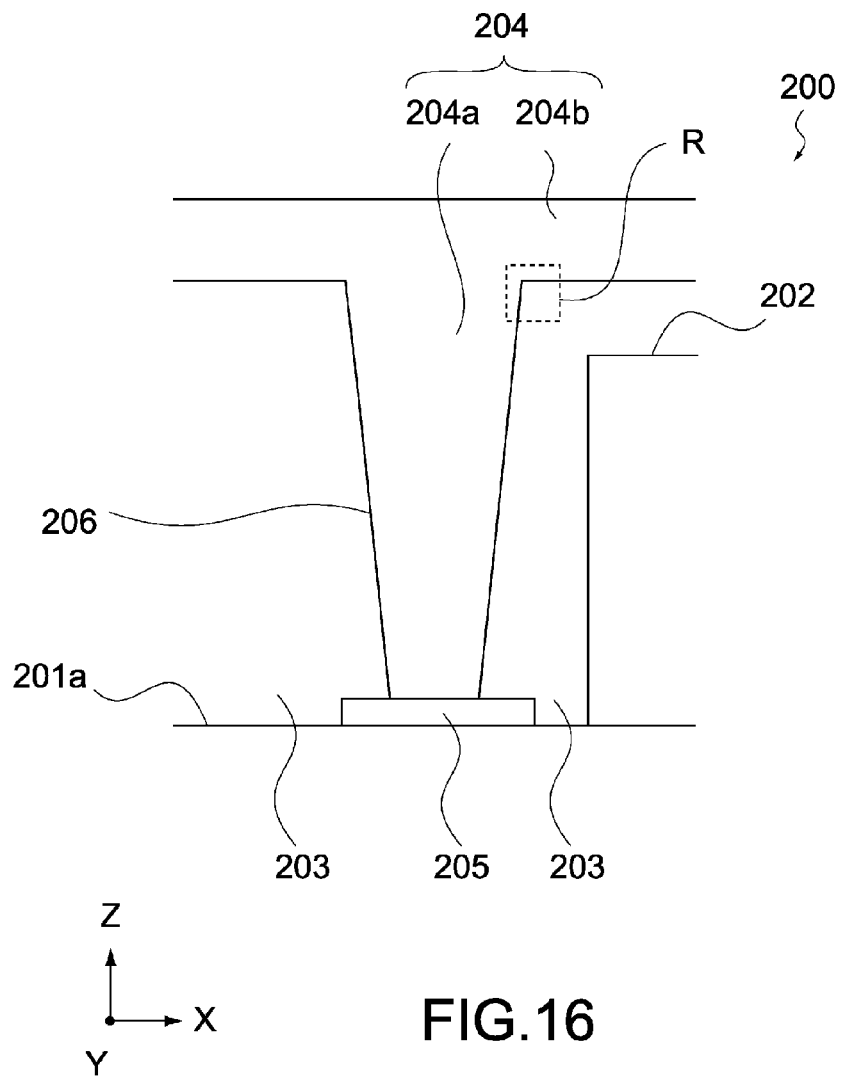
FIG. 16 is a schematic view of a circuit module according to a comparative embodiment.

As the inner shield section 104a formed between the second side walls 106b is thicker, shielding effectiveness of the inner shield section 104a becomes greater. FIG. 16 is a schematic view of a peripheral of a trench of a circuit module 200 according to a comparative example, and FIG. 17 is a schematic view of a peripheral of the trench of the circuit module 100 according to the embodiment.

As shown in FIG. 16, the circuit module 200 includes a circuit substrate 201, a mount component 202, sealing bodies 203, and a shield 204. On a mount surface 201a of the circuit substrate 201, a superficial conductor 205 is disposed, and the mount component 202 is mounted and is covered with the sealing body 203. A trench 206 is formed between the sealing bodies 203. The shield 204 has an inner shield section 204a formed in the trench 206 and an outer shield section 204b disposed on the main surfaces of the sealing bodies 203 and over the inner shield section 204a. As shown in FIG. 16, in the circuit module 200, a dead space R exists.

Figure 17:
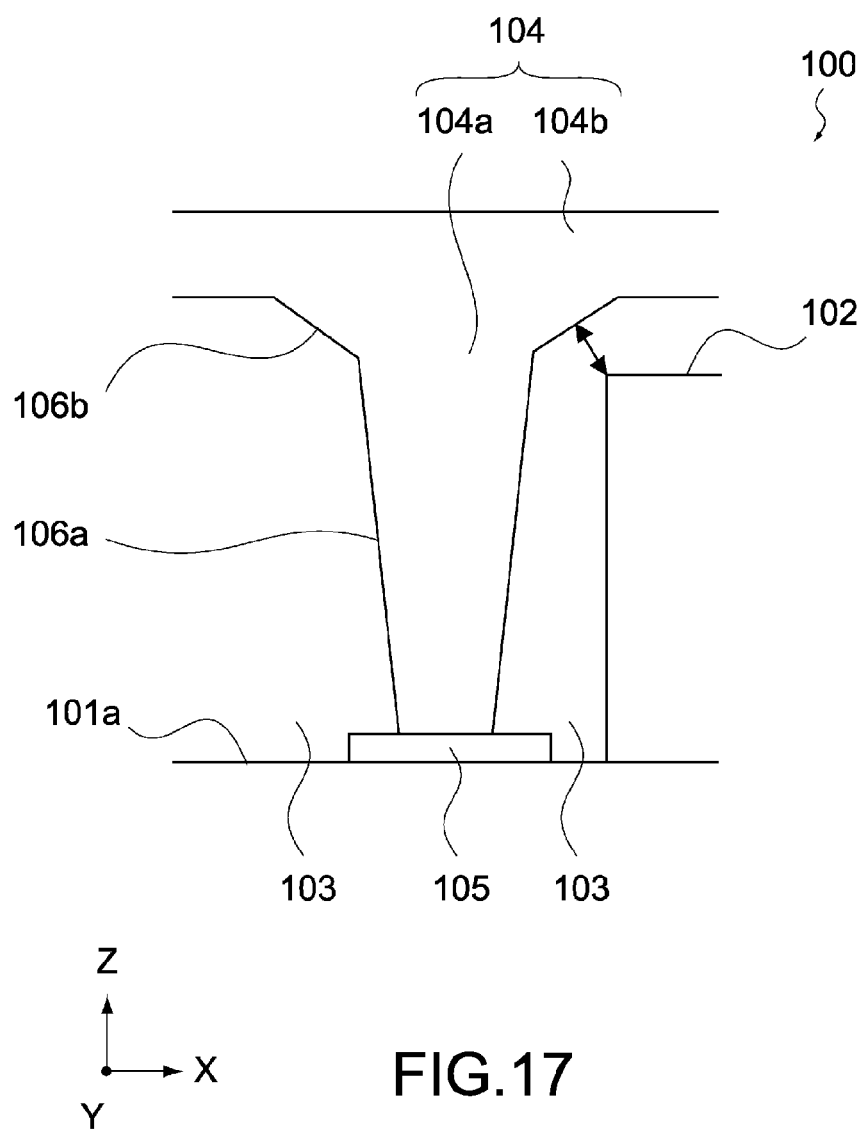
FIG. 17 is a schematic view of a circuit module according to an embodiment of the present disclosure.

In contrast, in the circuit module 100 according to the embodiment shown in FIG. 17, there is no such dead space, and the inner shield section 104a becomes thick, whereby it is possible to increase the shielding effectiveness as compared with the comparative circuit modules 200. In addition, as shown in FIG. 17, in the circuit module 100, a distance (an arrow in FIG. 17) between the mount component 102 and the inner shield section 104a gets closer than that in the circuit module 200. Because the shielding material of the shield 104 has a thermal conductivity higher than the sealing material of the sealing bodies 103, a heat from the mount components 102 can be released easily through the inner shield section 104a.

Figure 18:
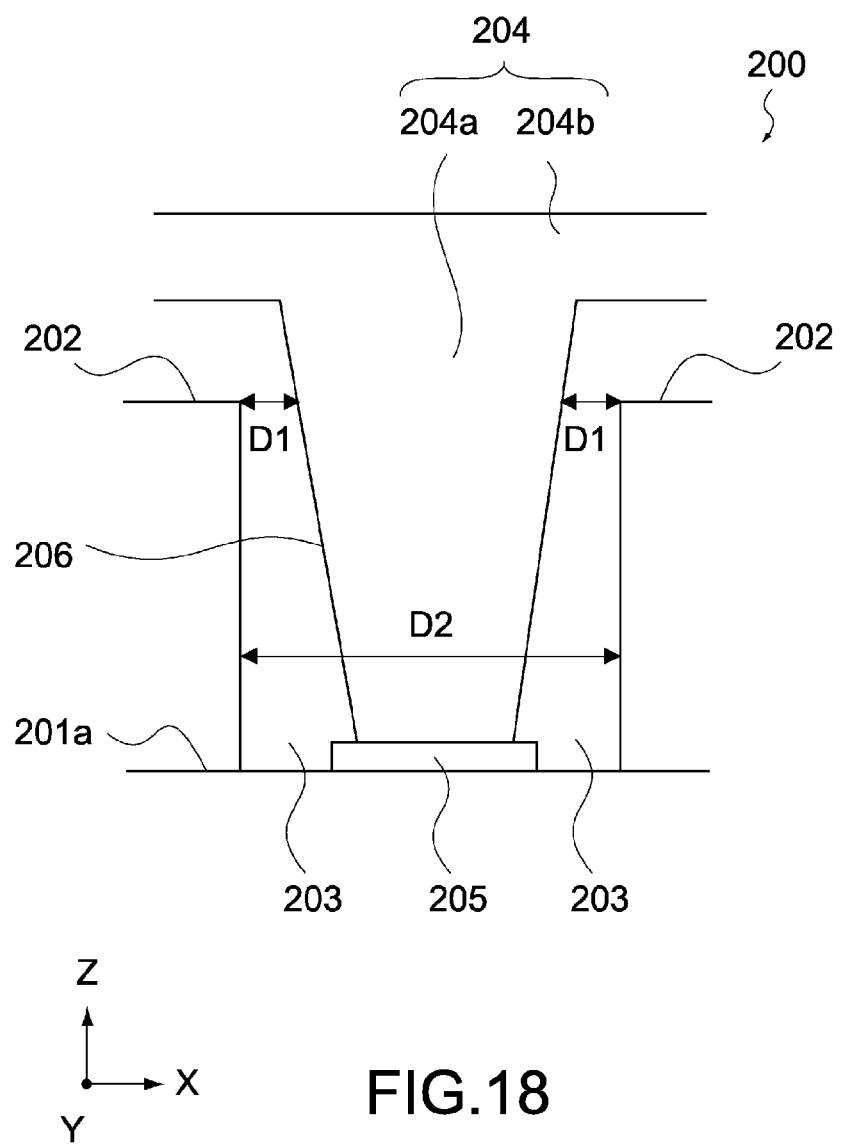
FIG. 18 is a schematic view of a circuit module according to a comparative embodiment.

Furthermore, it is possible to high-density mount the mount components 102 on the circuit substrate 101. FIG. 18 is a schematic view of a peripheral of a trench of the circuit module 200 according to comparative embodiment, and FIG. 19 is a schematic view of a peripheral of the trench of the circuit module 100 according to the embodiment.

As shown in FIG. 18, in the circuit module 200, in order to prevent the mount components 202 from exposing to the trench 206, it is necessary to set a certain distance (distance D1) between the mount components 202 and the trench 206. Thus, in order to improve filling properties of the shielding material, the trench 206 is widen, resulting in an enlarged distance (distance D2) between the mount components 202 via the trench 206.

Figure 19:
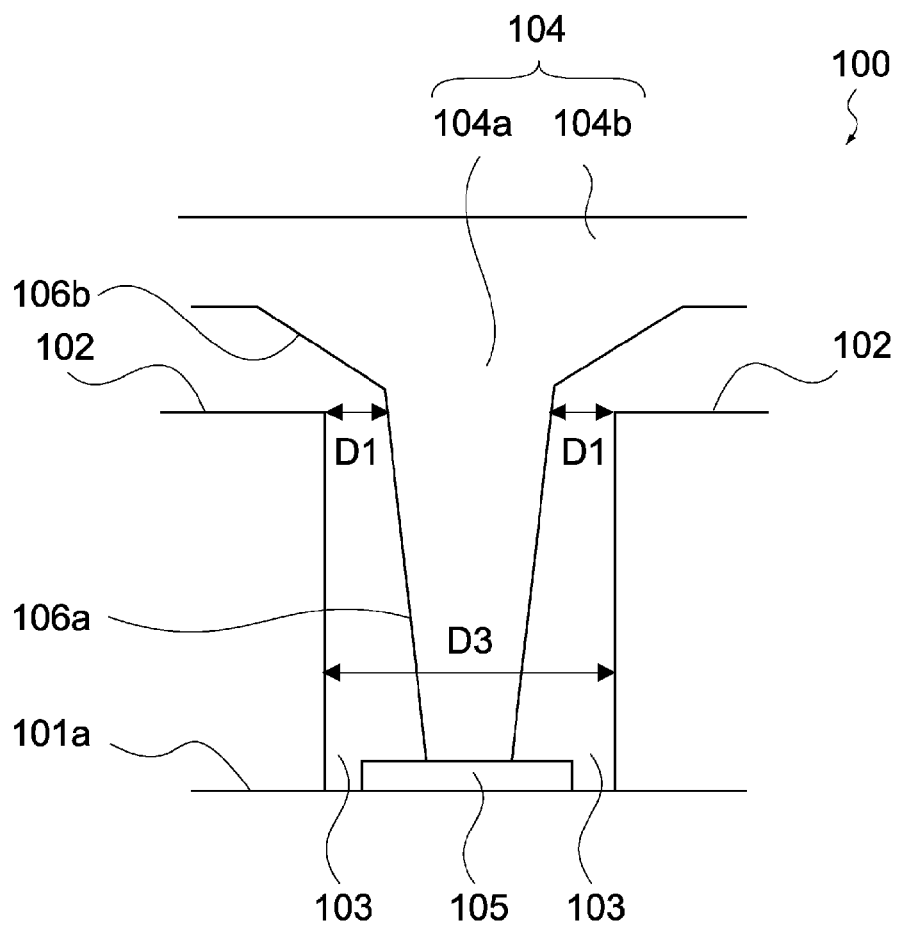
FIG. 19 is a schematic view of a circuit module according to an embodiment of the present disclosure.

In contrast, as shown in FIG. 19, in the circuit module 100, even if the distance between the second side walls 106b in the trench 106 is widened, the distance between the first side walls 106a is shorter than the distance between the second side walls 106b. Thus, when the distance between the mount components 102 and the trench 106 is the same as the distance D1 in comparative embodiment, a distance (distance D3) between the mount components 102 via the trench 106 is shorter than the distance D2. This is especially effective in the case where the above-described point P1 is higher than the mounted height (height H2) of the mount components 102. In this way, in the circuit module 100, it is possible to high-density mount the mount components 102.

[Alternative Embodiment]

Although the shielding material is the conductive resin in the above-described embodiment, it may be a metal film formed on the sealing body by plating. Also in this case, a plating liquid is easily infiltrated into the trench according to the present disclosure, thereby certainly forming the inner shield section within the trench.

While the embodiments of the present disclosure are described, it should be appreciated that the disclosure is not limited to the above-described embodiments, and variations and modifications may be made without departing from the spirit and scope of the present disclosure.

What is claimed is:

1. A circuit module, comprising:
   a circuit substrate having a mount surface;
   a mount component mounted on the mount surface;
   a sealing body formed on the mount surface, the sealing body covering the mount component and having a trench formed from a main surface of the sealing body to the mount surface, the trench including a side wall configured of a first section at a mount surface side and a second section at a main surface side, the first section and the second section are adjacent to each other, the first section having a first slope against the mount surface in a cross section perpendicular to the mount surface and perpendicular to an extending direction of the trench, when a connection point between the first section and the second section is defined as a first point and a connection point between the second section and the main surface is defined as a second point, a straight line connecting the first point and the second point having a second slope gentler than the first slope against the mount surface; and a shield covering the sealing body and having an inner shield section formed within the trench and an outer shield section disposed on the main surface and the inner shield, wherein the first point is disposed at a position higher than a mounted height of the mount component disposed adjacent to the trench, and wherein the mount component includes a plurality of mount components, and the trench is formed between the plurality of mount components such that the plurality of mount components are separated.

* * * * *